United States Patent
Kim

(10) Patent No.: US 12,051,708 B2
(45) Date of Patent: Jul. 30, 2024

(54) IMAGE SENSING DEVICE

(71) Applicant: SK hynix Inc., Icheon-si (KR)

(72) Inventor: Dong Ha Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 429 days.

(21) Appl. No.: 17/391,881

(22) Filed: Aug. 2, 2021

(65) Prior Publication Data

US 2022/0199667 A1 Jun. 23, 2022

(30) Foreign Application Priority Data

Dec. 21, 2020 (KR) ........................ 10-2020-0180008

(51) Int. Cl.
*H01L 27/146* (2006.01)

(52) U.S. Cl.
CPC .. *H01L 27/14621* (2013.01); *H01L 27/14627* (2013.01); *H01L 27/1463* (2013.01); *H01L 27/14645* (2013.01); *H01L 27/14685* (2013.01)

(58) Field of Classification Search
CPC ......... H01L 27/14621; H01L 27/14627; H01L 27/1463; H01L 27/14645; H01L 27/14685; H01L 27/14609; H01L 27/14607; H04N 25/70; G02B 5/201
See application file for complete search history.

(56) References Cited

U.S. PATENT DOCUMENTS

| | | |
|---|---|---|
| 9,818,783 B2 | 11/2017 | Ito |
| 2015/0381951 A1 | 12/2015 | Mlinar et al. |
| 2019/0019822 A1* | 1/2019 | Han ............... H01L 27/14685 |
| 2019/0157329 A1* | 5/2019 | Kim ............... H01L 27/1464 |
| 2019/0281240 A1* | 9/2019 | Jung ............... H04N 25/702 |
| 2020/0083268 A1 | 3/2020 | Kim et al. |
| 2022/0368867 A1* | 11/2022 | Sato ............... H04N 25/135 |

FOREIGN PATENT DOCUMENTS

| | | |
|---|---|---|
| CN | 110364541 A | 10/2019 |
| CN | 110365919 A | 10/2019 |
| KR | 20190017197 A | 2/2019 |

OTHER PUBLICATIONS

Office Action mailed Feb. 8, 2024, for CN Patent Application No. 202110818592.8, 16 pages with English translation.

* cited by examiner

*Primary Examiner* — Farun Lu
*Assistant Examiner* — Sandra Milena Rodriguez Villan
(74) *Attorney, Agent, or Firm* — Perkins Coie LLP

(57) ABSTRACT

An image sensing device includes a plurality of image pixels, phase detection pixels, a first grid structure, and a second grid structure. The image pixels perform conversion of incident light received through at least one first color filter so as to generate image signals indicative of a target object to be captured. The phase detection pixels perform conversion of incident light received through a second color filter so as to generate a phase signal for calculating a phase difference between images formed by the image signals. The first grid structure is disposed between any two of the first color filters and between any one of the first color filters and any one of the second color filters. The second grid structure is located adjacent to the first grid structure and disposed between any one of the first color filters and any one of the second color filter.

20 Claims, 8 Drawing Sheets

IMAGE SENSING DEVICE

CROSS-REFERENCE TO RELATED APPLICATION

This patent document claims the priority and benefits of Korean patent application No. 10-2020-0180008, filed on Dec. 21, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device including phase detection pixels to improve phase detection characteristics.

In one aspect, an image sensing device is provided to include: a plurality of image pixels configured to perform conversion of incident light received through at least one first color filter so as to generate image signals of a target object to be captured; at least one phase detection pixel configured to perform conversion of incident light received through a second color filter so as to generate a phase signal for calculating a phase difference between images formed by the image signals; a first grid disposed not only between the first color filters, but also between each of the first color filters and the second color filter; and a second grid disposed between the first color filter and the second color filter while being arranged adjacent to the first grid.

In another aspect, an image sensing device is provided to include a plurality of image pixels disposed to correspond to first color filters and configured to perform conversion of incident light from a target object to generate image signals indicative of the target object, first color filters placed above the image pixels to provide color filtering for the image pixels to capture color information of an image of the target object, phase detection pixels placed amongst the image pixels and configured to perform conversion of incident light to generate a phase signal including information on a phase difference between images formed by the image signals, second color filters placed above the phase detection pixels, respectively, to direct the incident light to the phase detection pixels, a first grid structure disposed between any two of the first color filters and between any one of the first color filters and any one of the second color filters, and a second grid structure located adjacent to the first grid structure and disposed between any one of the first color filters and any one of the second color filters.

In another aspect, an image sensing device is provided to include an image pixel array of image pixels, a plurality of color filters and a grid structure. The image pixels responsive to light to produce a pixel signal. The plurality of color filters may be placed over the image pixel array and arranged in a first direction and a second direction perpendicular to the first direction, and may filter incident light to be detected by the image pixel array, and a grid structure may be disposed between any two of the plurality of the color filters. The grid structure may include a first grid structure and a second grid structure. The first gird structure may include a first material layer. The second grid structure may be arranged adjacent to the first grid structure and may include a second material layer that has different characteristics from the first material layer.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device and the disclosed features may be implemented to achieve one or more advantages in more applications. Some implementations of the disclosed technology suggest designs of an image sensing device which includes phase detection pixels to improve phase detection characteristics. The disclosed technology provides various implementations of an image sensing device that improves structural characteristics of a grid structure, and thus acquires a low-exposure pixel signal using only one exposure.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
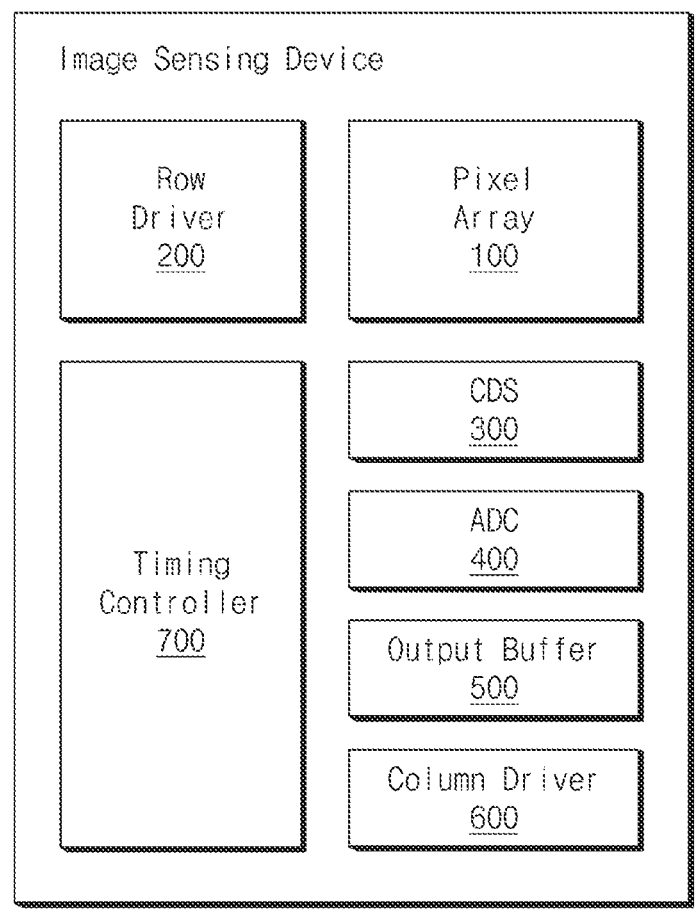
FIG. 1 is a block diagram illustrating an example of an image sensing device based on some implementations of the disclosed technology.

FIG. 1 is a block diagram illustrating an image sensing device according to an embodiment of the disclosed technology.

Referring to FIG. 1, the image sensing device may include a pixel array 100, a row driver 200, a correlated double sampler (CDS) 300, an analog-digital converter (ADC) 400, an output buffer 500, a column driver 600 and a timing controller 700. The components of the image sensing device illustrated in FIG. 1 are discussed by way of example only, and this patent document encompasses numerous other changes, substitutions, variations, alterations, and modifications.

The pixel array 100 may include a plurality of unit pixels arranged in rows and columns. In one example, the plurality of unit pixels can be arranged in a two dimensional pixel array including rows and columns. In another example, the plurality of unit pixels can be arranged in a three dimensional pixel array. The plurality of unit pixels may convert an optical signal into an electrical signal on a unit pixel basis or a pixel group basis, where unit pixels in a pixel group share at least certain internal circuitry. The plurality of unit pixels may include a plurality of imaging pixels and a plurality of phase detection pixels. Each of the image pixels may generate an image signal acting as an electrical signal corresponding to a target object to be captured. Each of the phase detection pixels may generate a phase signal acting as an electrical signal that is used to calculate a phase difference between images captured by the image pixels.

The pixel array 100 may receive driving signals, including a row selection signal, a reset signal and a transmission signal, from the row driver 200. Upon receiving the driving signal, corresponding unit pixels in the pixel array 100 may be activated to perform the operations corresponding to the row selection signal, the reset signal, and the transmission signal.

The row driver 200 may activate the pixel array 100 to perform certain operations on the unit pixels in the corresponding row based on commands and control signals provided by controller circuitry such as the timing controller 700. In some implementations, the row driver 200 may select one or more unit pixels arranged in one or more rows of the pixel array 100. The row driver 200 may generate a row selection signal to select one or more rows among the plurality of rows. The row decoder 200 may sequentially enable the reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 300. The reference signal may be an electrical signal that is provided to the CDS 300 when a sensing node of an imaging pixel (e.g., floating diffusion node) is reset, and the image signal may be an electrical signal that is provided to the CDS 300 when photocharges generated by the imaging pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured.

In some embodiments of the disclosed technology, the CDS 300 may sequentially sample and hold voltage levels of the reference signal and the image signal, which are provided to each of a plurality of column lines from the pixel array 100. That is, the CDS 300 may sample and hold the voltage levels of the reference signal and the image signal which correspond to each of the columns of the pixel array 100.

In some implementations, the CDS 300 may transfer the reference signal and the image signal of each of the columns as a correlate double sampling signal to the ADC 400 based on control signals from the timing controller 700.

The ADC 400 is used to convert analog CDS signals into digital signals. In some implementations, the ADC 400 may be implemented as a ramp-compare type ADC. The ramp-compare type ADC may include a comparator circuit for comparing the analog pixel signal with a reference signal such as a ramp signal that ramps up or down, and a timer for performing counting until a voltage of the ramp signal matches the analog pixel signal. In some embodiments of the disclosed technology, the ADC 400 may convert the correlate double sampling signal generated by the CDS 300 for each of the columns into a digital signal, and output the digital signal.

The ADC 400 may include a plurality of column counters. Each column of the pixel array 100 is coupled to a column counter, and image data can be generated by converting the correlate double sampling signals received from each column into digital signals using the column counter. In another embodiment of the disclosed technology, the ADC 400 may include a global counter to convert the correlate double sampling signals corresponding to the columns into digital signals using a global code provided from the global counter.

The output buffer 500 may temporarily hold the column-based image data provided from the ADC 400 to output the image data. In one example, the image data provided to the output buffer 500 from the ADC 400 may be temporarily stored in the output buffer 500 based on control signals of the timing controller 700. The output buffer 500 may provide an interface to compensate for data processing rate differences or transmission rate differences between the image sensing device and other devices.

The column driver 600 may select a column of the output buffer upon receiving a control signal from the timing controller 700, and sequentially output the image data, which are temporarily stored in the selected column of the output buffer 500. In some implementations, upon receiving an address signal from the timing controller 700, the column driver 600 may generate a column selection signal based on the address signal and select a column of the output buffer 500, outputting the image data as an output signal from the selected column of the output buffer 500.

The timing controller 700 may control operations of the row driver 200, the ADC 400, the output buffer 500 and the column driver 600.

The timing controller 700 may provide the row driver 200, the column driver 600, the ADC 400 and the output buffer 500 with a clock signal required for the operations of the respective components of the image sensing device, a control signal for timing control, and address signals for selecting a row or column. In an embodiment of the disclosed technology, the timing controller 700 may include a logic control circuit, a phase lock loop (PLL) circuit, a timing control circuit, a communication interface circuit and others.

Figure 2:
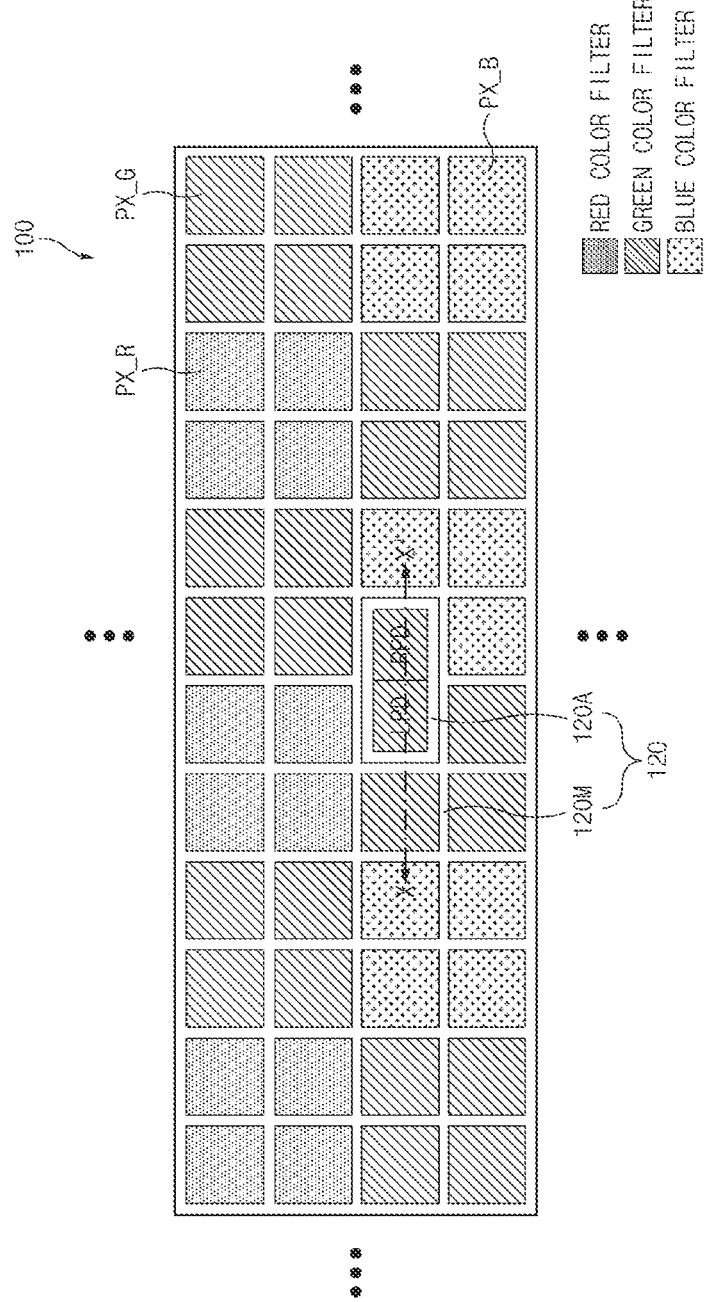
FIG. 2 is a plan view illustrating an example of some parts of a pixel array shown in FIG. 1 based on an embodiment of the disclosed technology.

FIG. 2 is a plan view illustrating an example of some parts of the pixel array 100 shown in FIG. 1 based on an embodiment of the disclosed technology.

Referring to FIG. 2, the pixel array 100 may include a plurality of unit pixels that are arranged in row and column directions. The plurality of unit pixels may include a plurality of image pixels PX_R, PX_G, and PX_B, and a plurality of phase detection pixels LPD and RPD. The plurality of image pixels PX_R, PX_G, and PX_B may generate image signals corresponding to a target object to be captured. The phase detection pixels LPD and RPD may generate phase signals for calculating a phase difference between images obtained from the captured target object.

To enable capturing color information in images, a color filter layer with different color filters is provided to cover the underlying photosensing elements and the spatial arrangement of the different color filters is designed to filter incident light using different color filters in adjacent pixels to capture color information of a scene or object to be imaged. One of suitable color filter arrangement is a Bayer color filter array of different color filters that include 50% of the total color filters to be green (G), 25% of the total color filters to be blue (B) and 25% of the total color filters to be red (R). One of different implementations of a Bayer color filter array for placing adjacent color filters of the same color in a row or column is a Quad-Bayer pixel structure, in which adjacent 2×2 pixels of a 4-pixel block are of the same color as a basic building block while achieving the Bayer color arrangement by having 50% of the total 4-pixel color filter blocks to be green (G), 25% of the total 4-pixel color filter blocks to be blue (B) and 25% of the total 4-pixel color filter blocks to be red (R).

The example in FIG. 2 shows one example of such a Quad-Bayer pixel structure to include a 4×4 4-pixel block pattern of one 4-pixel block of blue color filters, one 4-pixel block of red color filters, and two 4-pixel blocks of green color filters. Such a design is a specific implementation of achieving a Bayer pattern by including, in each of the image pixels PX_R, PX_G, and PX_B, a structure in which the unit pixels having color filters of the same color are arranged adjacent to each other in an (N×N) array (where, 'N' is a natural number of 2 or greater). For example, as shown in FIG. 2, each of the image pixels PX_R, PX_G, and PX_B has a quad structure in which four unit pixels having the same color are arranged in a (2×2) array. In some implementations, the image pixel PX_R may include red sub-pixel blocks, each of which has a structure in which four red pixels (PX_R) having red color filters are arranged in a (2×2) array, the image pixel PX_G may include green sub-pixel blocks, each of which has a structure in which four green pixels (PX_G) having green color filters are arranged in a (2×2) array, and the image pixel PX_B may include blue sub-pixel blocks, each of which has a structure in which blue color pixels (PX_B) having green color filters are arranged in a (2×2) array. The red sub-pixel blocks (PX_R), the green sub-pixel blocks (PX_G), and the blue sub-pixel blocks (PX_B) may be arranged in a Bayer pattern.

Among the unit pixels, in addition to image pixels, a plurality of phase detection pixels is also provided to be arranged in a horizontal direction and a vertical direction for detecting both a horizontal phase difference and a vertical phase difference. The plurality of phase detection pixels LPD and RPD may include two phase detection pixels adjacent to each other in a horizontal or vertical direction, or may include four phase detection pixels adjacent to each other in horizontal and vertical directions. FIG. 2 shows an example in which two phase detection pixels LPD and RPD are included, but other implementations are also possible. The phase detection pixels LPD and RPD that are adjacent to each other may include color filters of the same color. In one example, the phase detection pixels LPD and RPD shown in FIG. 2 include green color filters. In other implementations, the phase detection pixels LPD and RPD can include color filters other than green color filters.

In the pixel array 100, a grid structure 120 may be disposed between color filters of the unit pixels, such that crosstalk between adjacent color filters among the color filters can be prevented by the grid structure 120. The grid structure 120 may be formed in different shapes based on a position of the gird structure 120.

In one example, the grid structure 120 may include a first grid 120M and a second grid 120A.

The first grid 120M may include a metal layer 120M. The first grid 120M may be disposed between any two adjacent color filters of the image pixels PX_R, PX_G, and PX_B and between any color filter of the image pixel PX_R, PX_G, or PX_B and a color filter of the phase detection pixel LPD or RPD.

The second grid 120A may include a low-refraction index layer 120A such as an air layer. The second grid 120A may be disposed between any color filter of an image pixel PX_R, PX_G, or PX_B and any color filter of the phase detection pixel LPD or RPD. Thus, in a certain region between any color filter of the phase detection pixel LPD or RPD and any color filter of the image pixel PX_R, PX_G, or PX_B, the grid structure 120 may be formed as a double structure in which the metal layer 120M and the air layer 120A are stacked. In other regions than the certain region, the grid structure 120 may be formed as a single structure including the metal layer 120M. The first grid 120M and the second grid 120A may be located to surround the phase detection pixels LPD and RPD. In this case, the first grid 120M and the second grid 120A may be adjacent to each other such that the first grid 120M is located outside of the second grid 120A. The second grid 120A may be formed in a ring shape surrounding the phase detection pixels LPD and RPD.

As described above, since the air layer 120A may be formed to overlap with the metal layer 120M in the certain region between any color filter of the image pixel PX_R, PX_G, or PX_B and any color filter of the phase detection pixel LPD or RPD, the air layer 120A can more effectively block light that incurs crosstalk in the phase detection pixels LPD and RPD by a chief ray angle (CRA). Thus, it is possible to increase phase detection characteristics.

Figure 3:
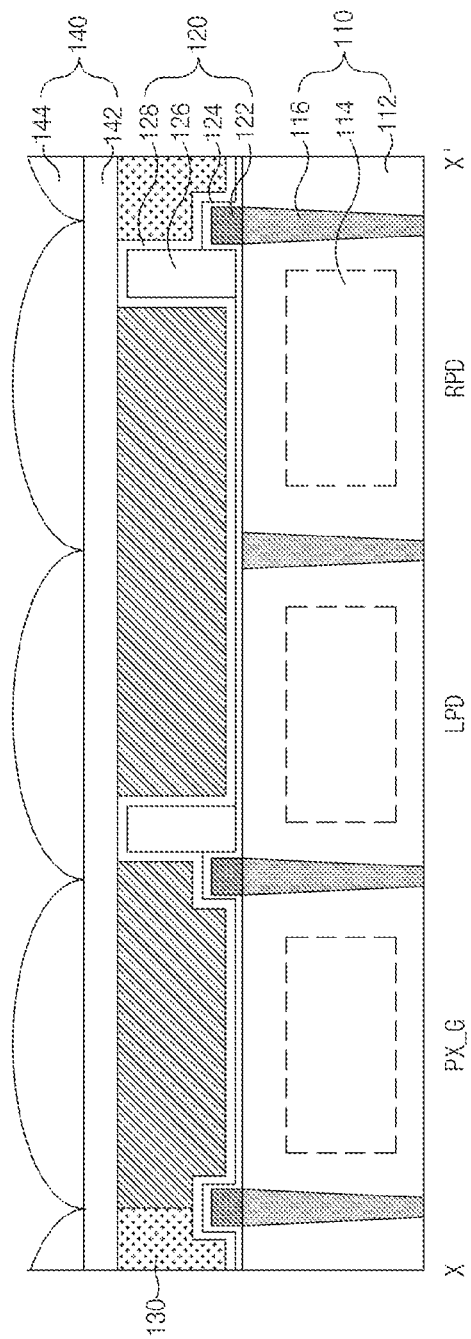
FIG. 3 is a cross-sectional view illustrating an example of the pixel array taken along the line X-X' shown in FIG. 2 based on some implementations of the disclosed technology.

FIG. 3 is a cross-sectional view illustrating an example of the pixel array 100 taken along the line X-X' shown in FIG. 2 based on some implementations of the disclosed technology.

Referring to FIGS. 2 and 3, the pixel array 100 may include a substrate layer 110, a grid structure 120, a color filter layer 130, and a lens layer 140.

The substrate layer 110 may include a substrate 112, a plurality of photoelectric conversion elements 114, and a plurality of device isolation structures 116. The substrate layer 110 may include a first surface and a second surface facing or opposite to the first surface. In this case, the first surface may refer to a light incident surface upon which external light is incident.

The substrate 112 may include a semiconductor substrate including a monocrystalline silicon material. The substrate 112 may include P-type impurities.

The photoelectric conversion elements 114 may be formed in the semiconductor substrate 112 so as to respectively correspond to the unit pixels. The photoelectric conversion elements 114 may perform photoelectric conversion of incident light (e.g., visible light) filtered by the color filter layer 130, and may thus generate photocharges. Each of the photoelectric conversion elements 114 may include N-type impurities.

Each of the device isolation structures 116 may be formed between photoelectric conversion elements 114 of the adjacent unit pixels within the substrate 112, and may thus isolate the photoelectric conversion elements 114 from each other. The device isolation structure 116 may include a trench structure such as a Back Deep Trench Isolation (BDTI) structure or a Front Deep Trench Isolation (FDTI) structure. Alternatively, the device isolation structure 116 may include a junction isolation structure formed by implanting high-density impurities (e.g., P-type impurities) into the substrate 112.

The grid structure 120 may be disposed between any two color filters to prevent crosstalk between the adjacent color filters. The grid structure 120 may be formed over the first surface of the substrate layer 110. The grid structure 120 may include the first grid 120M and the second grid 120A.

The first grid 120M may include a metal layer 122, a first capping layer 124, and a second capping layer 128. The second grid 120A may include an air layer 126 and a second capping layer 128.

The metal layer 122 may include tungsten (W). The metal layer 122 may be formed in a stacked structure of the tungsten and a barrier metal layer (not shown).

The first capping layer 124 may include a nitride film, and may be formed to extend below the air layer 126 and the color filter layer 130 while covering the metal layer 122. The first capping layer 124 may prevent expansion of the metal layer 122 in a thermal annealing process. In the first capping layer 124, a region formed below the color filter layer 130 may be used as a portion of an anti-reflection layer.

In the certain region between any color filter of the phase detection pixel LPD or RPD and any color filter of the image pixel PX_R, PX_G, or PX_B, the air layer 126 may be formed on an inner side of the first grid 120M. The air layer 126 may be formed over the first capping layer 124. Although FIG. 3 illustrates the air layer 126 has a top surface disposed higher than that of the metal layer 122, other implementations are also possible. For example, top surfaces of the air layer 126 and the metal layer 122 may be at a same height. In some implementations, the air layer 126 may have a top surface be disposed lower than that of the metal layer 122.

The second capping layer 128 may cover the air layer 126. The second capping layer 128 may include an oxide film. The oxide film may include an ultra low temperature oxide (ULTO) film such as a silicon oxide film ($SiO_2$). The second capping layer 128 may be formed to overlap with the first capping layer 124 in a region in which the first grid 120M and the color filter layer 130 are formed. In the second capping layer 128, a region formed below the color filter layer 130 may be used as a portion of the anti-reflection layer. Thus, in the first capping layer 124 and the second capping layer 128, some regions disposed below the color filter layer 130 may operate as an anti-reflection layer that compensates for a difference in refractive index between the color filter layer 130 and the substrate 112 and thus enables light having penetrated the color filter layer 130 to be effectively incident upon the substrate 112. Therefore, a separate anti-reflection layer need not be disposed between the color filter layer 130 and the substrate 112.

The color filter layer 130 may include color filters that filter visible light from among incident light received through the lens layer 140 and transmit the filtered light to the corresponding photoelectric conversion elements 114. The color filter layer 130 may include a plurality of red color filters (R), a plurality of green color filters (G), and a plurality of blue color filters (B). Each red color filter (R) may transmit red visible light having a first wavelength band. Each green color filter (G) may transmit green visible light having a second wavelength band shorter than the first wavelength band. Each blue color filter (B) may transmit blue visible light having a third wavelength band shorter than the second wavelength band. The color filter layer 130 may be formed over the substrate layer 110 in a region defined by the first grid 120M and the second grid 120A.

The lens layer 140 may include an over-coating layer 142 and a plurality of microlenses 144. The over-coating layer 142 may be formed over the color filter layer 130. The over-coating layer 142 may operate as a planarization layer to compensate for (or remove) a step difference caused by the color filter layer 130. The microlenses 144 may be formed over the over-coating layer 142. Each of the microlenses 144 may be formed in a hemispherical shape, and may be formed per unit pixel (PX). The microlenses 144 may converge incident light, and may transmit the converged light to the corresponding color filters R, G, and B. The over-coating layer 142 and the microlenses 144 may be formed of the same materials.

FIGS. 4A to 4D are cross-sectional views illustrating examples of methods for forming a grid structure based on some implementations of the disclosed technology. As discussed with reference to FIG. 3, the gird structure includes a first grid and a second grid.

Figure 4A:
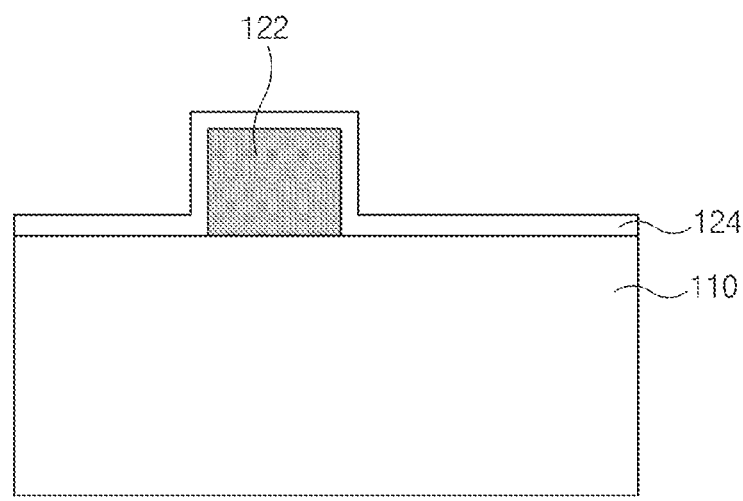
FIGS. 4A to 4D are cross-sectional views illustrating examples of methods for forming a first grid and a second grid shown in FIG. 3 based on some implementations of the disclosed technology.

Referring to FIG. 4A, a metal material may be formed over the substrate layer 110 that includes photoelectric conversion elements and device isolation structures.

For example, after the metal material is formed over the substrate layer 110, the metal material may be etched using a mask pattern (not shown) defining a grid structure region as an etch mask, resulting in formation of the metal layer 122. In this case, the metal layer 122 may include tungsten (W).

Subsequently, the first capping layer 124 may be formed over the substrate layer 110 and the metal layer 122. In this case, the first capping layer 124 may include a nitride film.

Figure 4B:
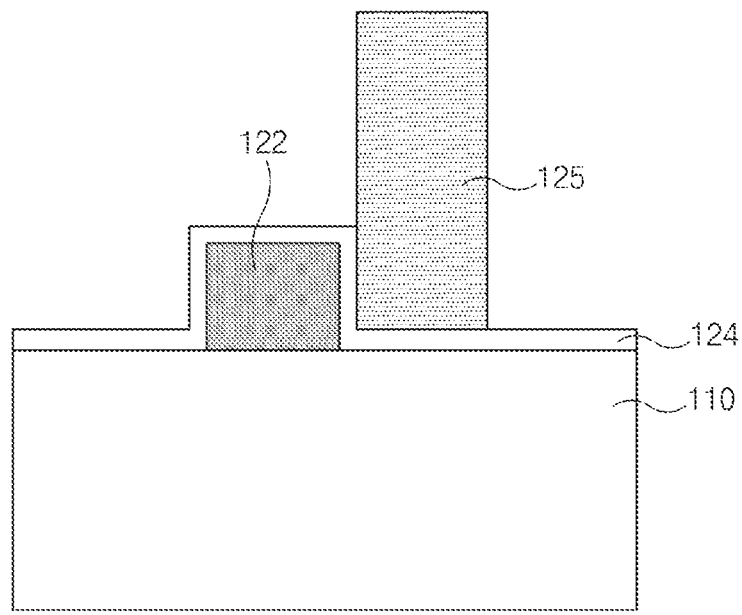

Referring to FIG. 4B, a sacrificial film pattern 125 may be formed over the first capping layer 124 in a region to be used as a formation region of the second grid 120A.

For example, after a sacrificial film (not shown) is formed over the entirety of the first capping layer 124, a mask pattern (not shown) defining the region of the second grid 120A may be formed over the sacrificial film. In this case, the sacrificial film may include a carbon-containing Spin On Carbon (SOC) film. Subsequently, the sacrificial film may be etched using the mask pattern as an etch mask, resulting in formation of the sacrificial film pattern 125.

Figure 4C:
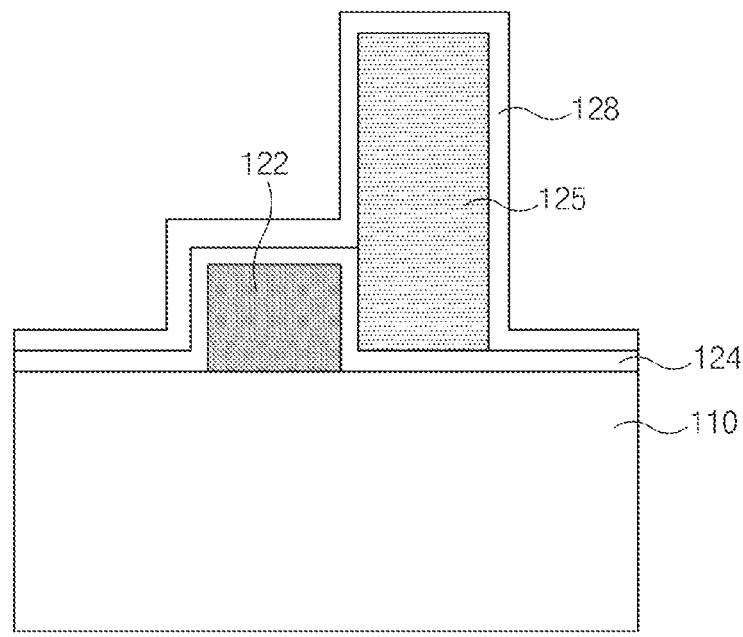

Referring to FIG. 4C, the second capping layer 128 may be formed over the first capping layer 124 and the sacrificial film pattern 125.

In this case, the second capping layer 128 may include an Ultra Low Temperature Oxide (ULTO) film. In some implementations, the second capping layer 128 may be formed to a predetermined thickness through which molecules formed by combining gas with carbon of the sacrificial film pattern 125 can be easily discharged outside.

Figure 4D:
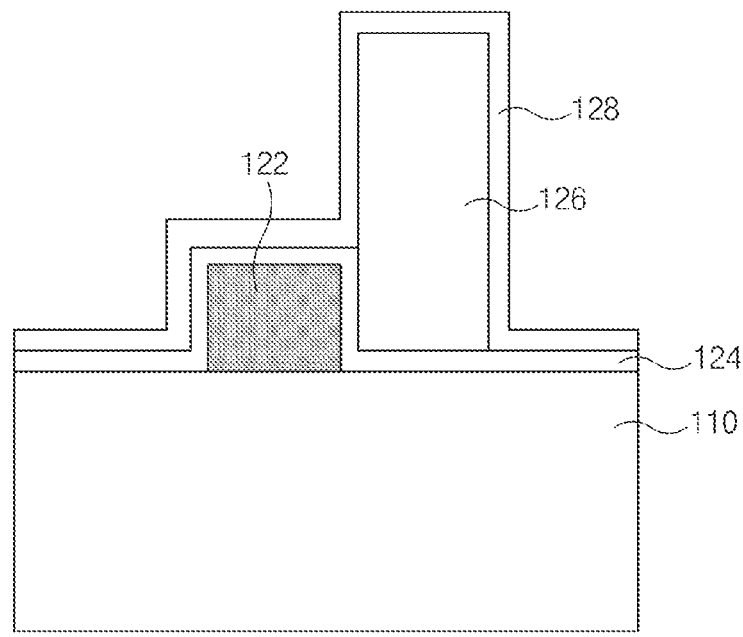

Referring to FIG. 4D, a plasma process may be carried out upon the resultant structure of FIG. 4C, such that the sacrificial film pattern 125 may be removed and the air layer 126 may be formed at the position from which the sacrificial film pattern 125 is removed. In some implementations, the plasma process may be carried out using gas (e.g., $O_2$, $N_2$, $H_2$, CO, $CO_2$, or $CH_4$) including at least one of oxygen, nitrogen, or hydrogen.

Referring to FIG. 4C, if the $O_2$ plasma process is carried out upon the resultant structure of FIG. 4C, oxygen radicals (O*) may flow into the sacrificial film pattern 125 through the second capping layer 128, and the oxygen radicals (O*) included in the sacrificial film pattern 125 may be combined with carbons of the sacrificial film pattern 125, resulting in formation of CO or $CO_2$. The formed CO or $CO_2$ may be discharged outside through the second capping layer 128.

As a result, the sacrificial film pattern 125 can be removed, and the air layer 126 may be formed at the position where the sacrificial film pattern 125 is removed.

The color filter layer 130 may be formed over the second capping layer 128 to fill regions defined by the first grid 120M and the second grid 120A, and the lens layer 140 may be formed over the color filter layer 130.

Figure 5:
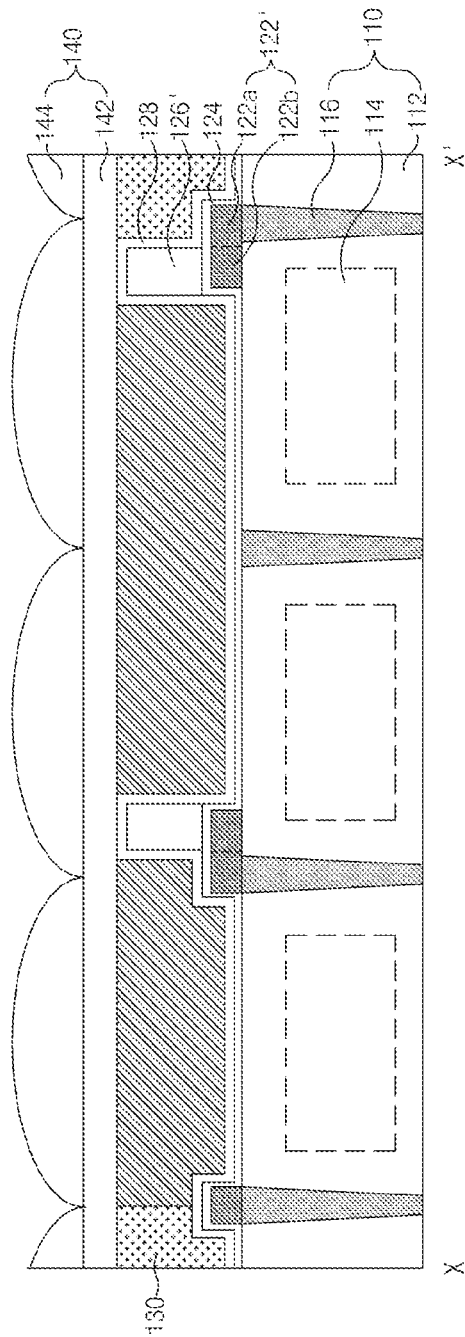
FIG. 5 is a cross-sectional view illustrating another example of the pixel array taken along the line X-X' shown in FIG. 2 based on some implementations of the disclosed technology.

FIG. 5 is a cross-sectional view illustrating another example of the pixel array 100 taken along the line X-X' shown in FIG. 2 based on some implementations of the disclosed technology.

Referring to FIGS. 2 and 5, the second grid 120A may be formed in a hybrid structure indicating a stacked structure of the metal layer and the air layer. For example, the first grid 120M may include a metal layer 122a, the first capping layer 124, and the second capping layer 128. The second grid 120A may include a metal layer 122b, a first capping layer 124, an air layer 126', and the second capping layer 128.

In some implementations, the metal layer 122' disposed between the color filters of the image pixels PX_R, PX_G, and PX_B and the color filters of the phase detection pixels LPD and RPD may be formed to have a larger width such that the metal layer 122' can extend below the air layer 126', differently from the above-mentioned metal layer 122.

Although the metal layer 122' shown in FIG. 5 is divided into two metal layers 122a and 122b for convenience of description, the scope or spirit of the disclosed technology is not limited thereto, and the two metal layers 122a and 122b can also be integrated into one structure as necessary.

As is apparent from the above description, the image sensing device based on some implementations of the disclosed technology can improve structural characteristics of a grid structure, and can thus acquire both a low-exposure pixel signal using only one exposure.

Although a number of illustrative embodiments have been described, it should be understood that modifications of the disclosed embodiments and other embodiments can be devised based on what is described and/or illustrated in this patent document.

What is claimed is:

1. An image sensing device, comprising:
a plurality of image pixels configured to perform conversion of incident light received through first color filters so as to generate image signals indicative of a target object;
phase detection pixels placed amongst the image pixels and configured to perform conversion of incident light received through second color filters so as to generate a phase signal including information on a phase difference between images formed by the image signals;
a first grid structure disposed between any two of the first color filters and between any one of the first color filters and any one of the second color filters; and
a second grid structure located adjacent to the first grid structure and disposed between any one of the first color filters and any one of the second color filters,
wherein the first grid structure and the second grid structure are formed as a double structure in which the first grid structure and the second grid structure surround the second color filters, and
wherein the first grid structure surrounds the second grid structure.

2. The image sensing device according to claim 1, wherein:
the first grid structure and the second grid structure include different material layers from each other.

3. The image sensing device according to claim 2, wherein:
the first grid structure includes a metal layer.

4. The image sensing device according to claim 3, wherein the first grid structure further includes:
a capping layer formed to cover the metal layer.

5. The image sensing device according to claim 4, wherein:
the capping layer includes a stacked structure in which insulation layers having different characteristics are stacked.

6. The image sensing device according to claim 2, wherein the second grid structure includes an air layer.

7. The image sensing device according to claim 6, wherein the second grid structure further includes:
a capping layer disposed to cover the air layer.

8. The image sensing device according to claim 6, wherein the second grid structure includes:
a hybrid structure in which a metal layer and the air layer are vertically stacked.

9. The image sensing device according to claim 8, wherein the second grid structure further includes:
a first capping layer disposed between the metal layer and the air layer; and
a second capping layer disposed to cover the air layer.

10. The image sensing device according to claim 9, wherein:
the first capping layer and the second capping layer include insulation layers having different characteristics.

11. The image sensing device according to claim 1, wherein:
the second grid structure has a ring shape surrounding each of the second color filters.

12. The image sensing device according to claim 1, wherein:
The first color filters include two adjacent color filters of a common color.

13. An image sensing device, comprising:
a plurality of color filters arranged in a first direction and a second direction perpendicular to the first direction, and configured to filter incident light; and
a grid structure disposed between any two of the plurality of the color filters,
wherein the grid structure includes:
a first grid structure including a first material layer; and
a second grid structure arranged adjacent to the first grid structure and including a second material layer that has different characteristics from the first material layer,
wherein the first grid structure surrounds the second grid structure.

14. The image sensing device according to claim 13, wherein:
the first material layer includes a metal layer.

15. The image sensing device according to claim 13, wherein:
the second material layer includes an air layer.

16. The image sensing device according to claim 13, wherein the second grid structure includes:
a hybrid structure in which the first material layer and the second material layer are stacked.

17. The image sensing device according to claim 13, further comprising phase detection pixels amongst the image pixels to generate a phase signal indicative of a phase difference between images formed by pixel signals from the image pixels, and
wherein the plurality of color filters includes:
first color filters disposed over the image pixels to filter incident light to be detected by the image pixels to capture color information in the incident light; and
second color filters disposed over the phase detection pixels and configured to filter light to be detected by the phase detection pixels.

18. The image sensing device according to claim 17, wherein:
the second grid structure has a ring shape surrounding the second color filters.

19. The image sensing device according to claim 17, wherein:
the first color filters include two adjacent first color filters of a same color.

20. The image sensing device according to claim 17, wherein the first color filters include blocks of 2×2 first color filters where each block of 2×2 first color filters includes first color filters of a common color.

* * * * *